United States Patent
Katoch

(10) Patent No.: US 9,305,623 B2
(45) Date of Patent: Apr. 5, 2016

(54) WRITE ASSIST CIRCUIT FOR WRITE DISTURBED MEMORY CELL

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 6 days.

(21) Appl. No.: 14/089,819

(22) Filed: Nov. 26, 2013

(65) Prior Publication Data

US 2015/0146470 A1    May 28, 2015

(51) Int. Cl.
| | | |
|---|---|---|
| G11C 7/00 | (2006.01) |
| G11C 7/24 | (2006.01) |
| G11C 5/06 | (2006.01) |
| G11C 7/22 | (2006.01) |
| G11C 11/419 | (2006.01) |
| G11C 7/10 | (2006.01) |

(52) U.S. Cl.
CPC ........ *G11C 7/24* (2013.01); *G11C 5/063* (2013.01); *G11C 7/109* (2013.01); *G11C 7/1075* (2013.01); *G11C 7/1096* (2013.01); *G11C 7/22* (2013.01); *G11C 11/419* (2013.01)

(58) Field of Classification Search
CPC ...... G11C 11/412; G11C 11/419; G11C 7/22; G11C 7/1075; G11C 7/1072; G11C 7/1078; G11C 7/1087
USPC .............. 365/189.16, 154, 189.09, 156
See application file for complete search history.

(56) References Cited

U.S. PATENT DOCUMENTS

| | | | |
|---|---|---|---|
| 7,495,969 B2 * | 2/2009 | Joshi et al. ............... | 365/189.05 |
| 8,879,334 B2 * | 11/2014 | Ishii et al. ............. | 365/189.011 |
| 8,891,289 B2 * | 11/2014 | Hwang et al. ................ | 365/154 |

* cited by examiner

*Primary Examiner* — David Lam
(74) *Attorney, Agent, or Firm* — Hauptman Ham, LLP

(57) ABSTRACT

A circuit comprises a first memory cell, a second memory cell, and a disturb control circuit. The first memory cell has a first port and a second port. The first port is associated with a first write assist circuit. The second port is associated with a second write assist circuit. The second memory cell has a third port and a fourth port. The third port is associated with a third write assist circuit. The fourth port is associated with a fourth write assist circuit. The disturb control circuit is configured to selectively turn on at least one of the first write assist circuit, the second write assist circuit, the third write assist circuit, or the fourth write assist circuit according to whether the first port, the second port, the third port, or the fourth port is determined to be write disturbed.

20 Claims, 7 Drawing Sheets

WRITE ASSIST CIRCUIT FOR WRITE DISTURBED MEMORY CELL

FIELD

The present disclosure is related to write assist circuits for write disturbed memory cells.

BACKGROUND

For illustration, VDDmin is the minimum value of a supply voltage VDD to be provided to a memory cell, and VDDmax is the maximum value of the supply voltage VDD to be provided to the memory cell. In some approaches, a memory cell comprises two read-write ports, and is specified to function when the supply voltage VDD is within a range of VDDmin and VDDmax value. For simplicity, a read-write port is called a port.

A write disturb occurs, for example, when a first port is used to write to the memory cell and is disturbed by a "dummy" read from the second port of the same memory cell. A dummy read refers to a situation in which signals for the port are in a read condition, but the data is not reliable, and therefore is not used. Generally, the dummy read from the second port increases a load on a storage node to be written, and thus prolongs the write time from the first port.

In many situations, when a write disturb occurs, the write operation cannot operate at VDDmin value. In some application, a write assist circuit is turned on so that the write operation and the memory cell continue to function at VDDmin value. In some designs, the write assist circuit consumes about 20% of the total active power of the memory cell. Further, the write assist circuit is turned on every time the memory cell is write-accessed, which increases power consumption of the memory cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
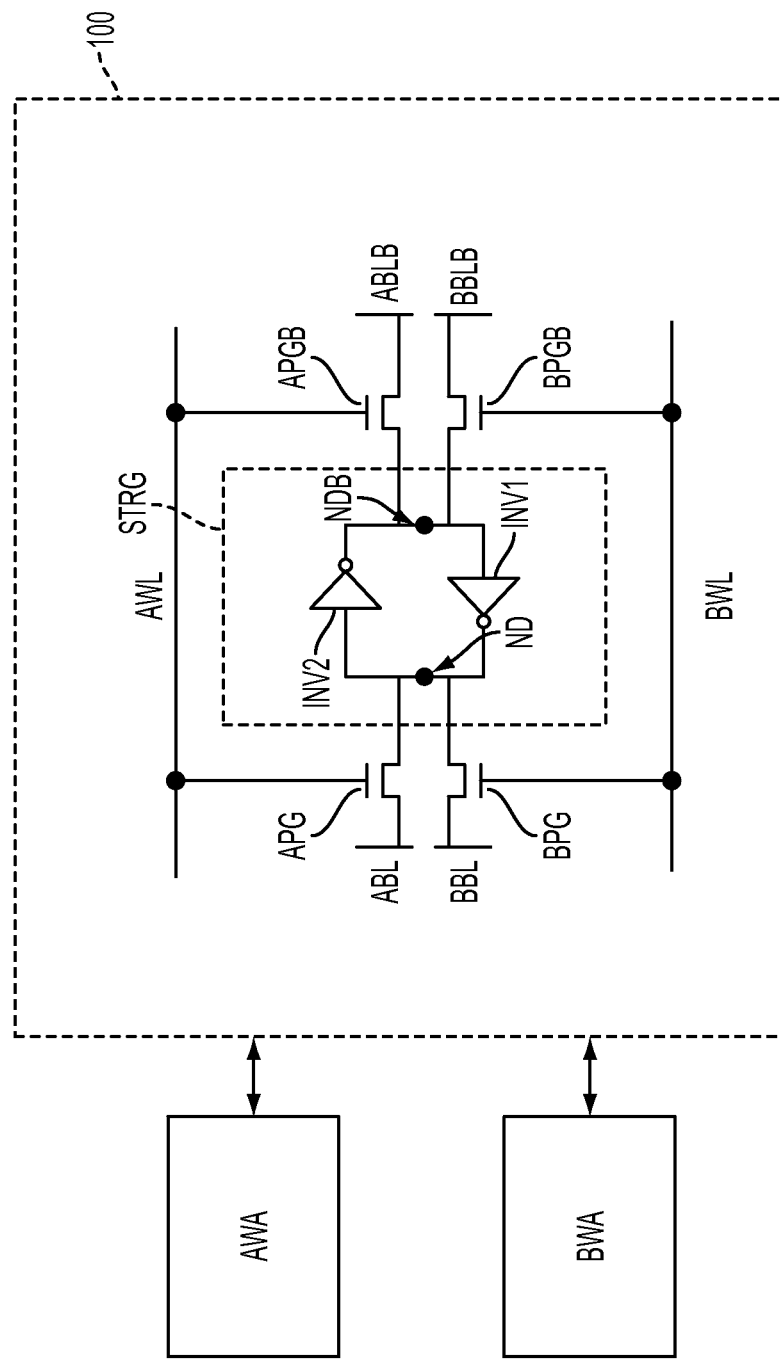
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a circuit is configured to detect whether a write disturb occurs, and, if so, a write assist circuit is turned on to improve the predetermined minimum supply voltage value VDDmin. In contrast, if the write disturb does not occur, the write assist circuit remains to be off. As a result, in some embodiments, power consumption of the memory cell is reduced by about 20%. Further, lifetime of the memory cell is prolonged because the stress caused by the write assist voltage decreases.

Memory Cell

FIG. 1 includes a diagram of a memory cell 100, in accordance with some embodiments.

A storage area STRG includes two storage nodes ND and NDB to store data for memory cell 100. Node ND is at an output of an inverter INV1 and node NDB is at an output of an inverter INV2. Inverters INV1 and INV2 are cross-coupled. Node ND is associated with transistors or pass gates APG and BPG, and node NDB is associated with pass gates APGB and BPGB. By operation of memory cell 100, a logical value of node ND or node NDB is an inverse of one another.

A word line AWL and a pair of pass gates APG and APGB form a first read-write port, and, for illustration, is called a port A (not labeled). A word line BWL and a pair of pass gates BPG and BPGB form a second read-write port, and, for illustration, is called a port B (not labeled). When memory cell 100 is write accessed using the first read-write port A, for example, data to be written to memory cell 100 is applied to bit line ABL and bit line ABLB at a drain of corresponding pass gates APG and APGB. Word line AWL is then activated with a high logical value to turn on pass gates APG and APGB. As a result, the data on bit line ABL is transferred through pass gate APG to node ND, and the data on bit line ABLB is transferred through pass gate APGB to node NDB. In other words, memory cell 100 is written with the data applied to bit lines ABL and ABLB. For another example, when memory cell 100 is read accessed using the first read-write port A, bit lines ABL and ABLB are pre-charged to a high logical value. Word line AWL is then activated with a high logical value to turn on pass gates APG and APGB. As a result, the data on node ND is transferred to bit line ABL, and the data on node NDB is transferred to bit line ABLB. The data on bit lines ABL and ABLB is then processed accordingly to reveal the data on corresponding nodes ND and NDB. Operations of the second read-write port B are similar to those of the first read-write port A.

In some embodiments, word lines AWL and BWL are each coupled to memory cells 100 in a row of a memory array. Further, bit lines ABL and ABLB are each coupled to memory cells 100 in a column of the memory array. Similarly, bit lines BBL and BBLB are each coupled to the memory cells 100 in the same column of bit lines ABL and ABLB. Word lines AWL and BWL are each also called a control line because word lines AWL and BWL control operations of corresponding pass gates APG, APGB, BPG, and BPGB, for both read and write operations. Bit lines ABL, ABLB, BBL, and BBLB are each also called a data line because bit lines ABL, ABLB, BBL, and BBLB carry data for memory cell 100.

In some embodiments, each of port A and port B is associated with a write assist circuit. For example, port A is associated with a write assist circuit AWA, and port B is associated with a write assist circuit BWA. Further, when a write disturb occurs to a port of memory cell 100, a write assist circuit associated with the port is turned on to assist that port in the write operation. For example, port A is used to write data to memory cell 100, and if port A is disturbed by a dummy read from port B, write assist circuit AWA is turned on to assist port A with the write operation from port A. But if port B is used to write and is disturbed by a dummy read from port A, write assist circuit BWA is turned on to assist port B with the write operation from port B.

Memory cell 100 shown having two ports is for illustration. A memory cell having more than two ports is within the contemplated scope of the present disclosure.

Memory Row, Disturb Illustration

Figure 2:
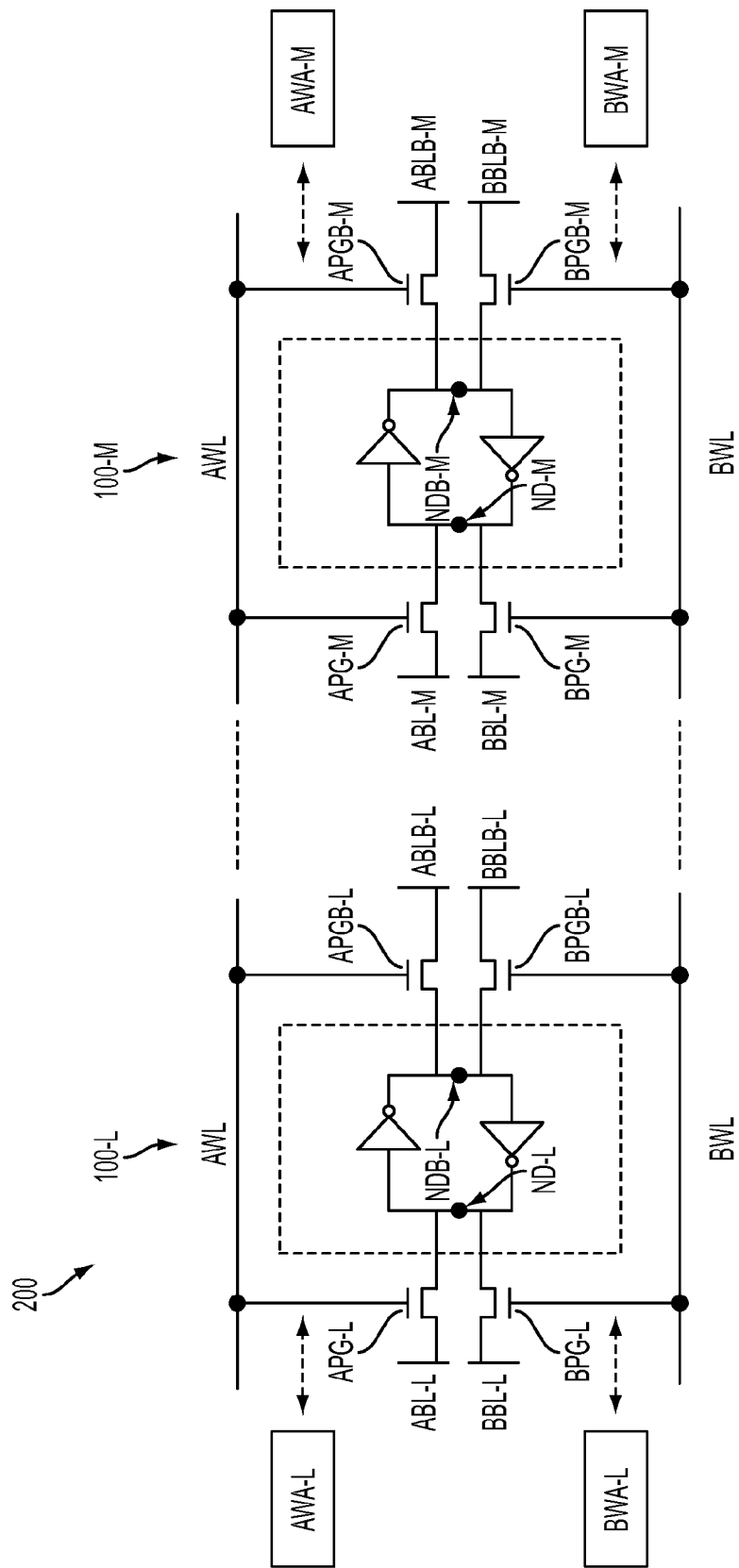
FIG. 2 is a diagram of a row of memory cells in FIG. 1, in accordance with some embodiments.

FIG. 2 is a diagram of a row 200 of a plurality of memory cells 100 in FIG. 1, in accordance with some embodiments. For illustration, two memory cells including a memory cell 100-L and a memory cell-M are shown. Word line AWL is associated with port A of cell 100-L and port A of cell 100-M. Word line BWL is associated with port B of cell 100-L and port B of cell 100-M. For illustration, ports A and B of cell 100-L are called ports A-L and B-L, respectively, and ports A and B of cell 100-M are called ports A-M and B-M, respectively. Write assist circuits AWA-L and BWA-L are associated with ports A-L and B-L, respectively. Write assist circuits AWA-M and BWA-M are associated with ports A-M and B-M, respectively. Memory cell 100-L and memory cell 100-M are each in a column (not shown) of the memory array.

For illustration, both word lines AWL and BWL are activated with a high logical value. As a result, pass gates APG-M, APGB-M, BPG-M, and BPGB-M of cell 100-M are turned on. Port A-M and port B-M of cell 100-M thus each could have a write, a read, or a dummy read operation. For further illustration, port A-L of cell 100-L is used to write to cell 100-L. As a result, data to be written to cell 100-L is applied to bit lines ABL-L and ABLB-L. Because word line BWL is activated, pass gates BPG-L and BPGB-L of cell 100-L are turned on, and the data on nodes ND-L and NDB-L is transferred to corresponding bit lines BLB-L and BBLB-L. In other words, port B-L of cell 100-L experiences a dummy read. When port A-L is write accessed, and a dummy read occurs on port B-L, port A-L is write disturbed.

For illustration, a write disturb occurs to port A-L due to a dummy read from port B-L. In some embodiments, in such a condition, write assist circuit AWA-L is turned on to assist port A-L with the write operation. Various embodiments of the disclosure are advantageous over other approaches. For example, write assist circuit AWA-L is turned on when the write disturb to port A-L is detected and is off when the write disturb to port A-L is not detected. As a result, write assist circuit AWA-L consumes power when the write disturb occurs, but does not consume power or consume insignificant power when the write disturb does not occur. In contrast, in other approaches, write assist circuit AWA-L is turned on when port A-L is invoked for writing, regardless of whether a write disturb to port A-L actually occurs or not. In various embodiments of the present disclosure, compared to those other approaches, power consumption with reference to the write assist circuit is reduced by about 20%.

In the above illustration, port A-L is write accessed and port B-L has a dummy read that causes a write disturb to port A-L is for illustration. Turning on a corresponding write assist circuit when a port is write disturbed is also applicable when port B-L is write accessed and port A-L has a dummy read. In such a situation, write assist circuitry BWA-L associated with port B-L is turned to assist port B-L with the write operation.

In various embodiments, when port A-L is write accessed and port B-L has a dummy read, port A-M and port B-M of cell 100-M could be read accessed, or one of the port A-M or port B-M is write accessed and the other port is dummy read accessed. If port A-M is write accessed, and port B-M is dummy read accessed and thus causes a write disturb to port A-M, in various embodiments of the present disclosure, write assist circuit AWA-M associated with port A-M is turned on to assist port A-M with the write operation.

Similarly, in various embodiments, when port B-L is write accessed and port A-L is dummy read accessed, port A-M and port B-M of cell 100-M could be both read accessed, or one of port A-M or port B-M is write accessed and the other port is dummy read accessed. If port A-M is write accessed, and port B-M is dummy read accessed and causes a write disturb to port A-M, in various embodiments of the present disclosure, write assist circuit AWA-M is turned on to assist port A-M with the write operation. In contrast, if port B-M is write accessed, and port A-M is dummy read accessed and causes a write disturb to port B-M, in various embodiments of the present disclosure, write assist circuit BWA-M is turned on to assist port B-M with the write operation.

Based on the above illustrations, in various embodiments of the present disclosure, when a port is write accessed and is disturbed by a dummy read from another port of the same cell, the write assist circuit associated with the port that is write accessed is turned on to assist the port that is write accessed.

Waveforms, No Disturb

Figure 3:
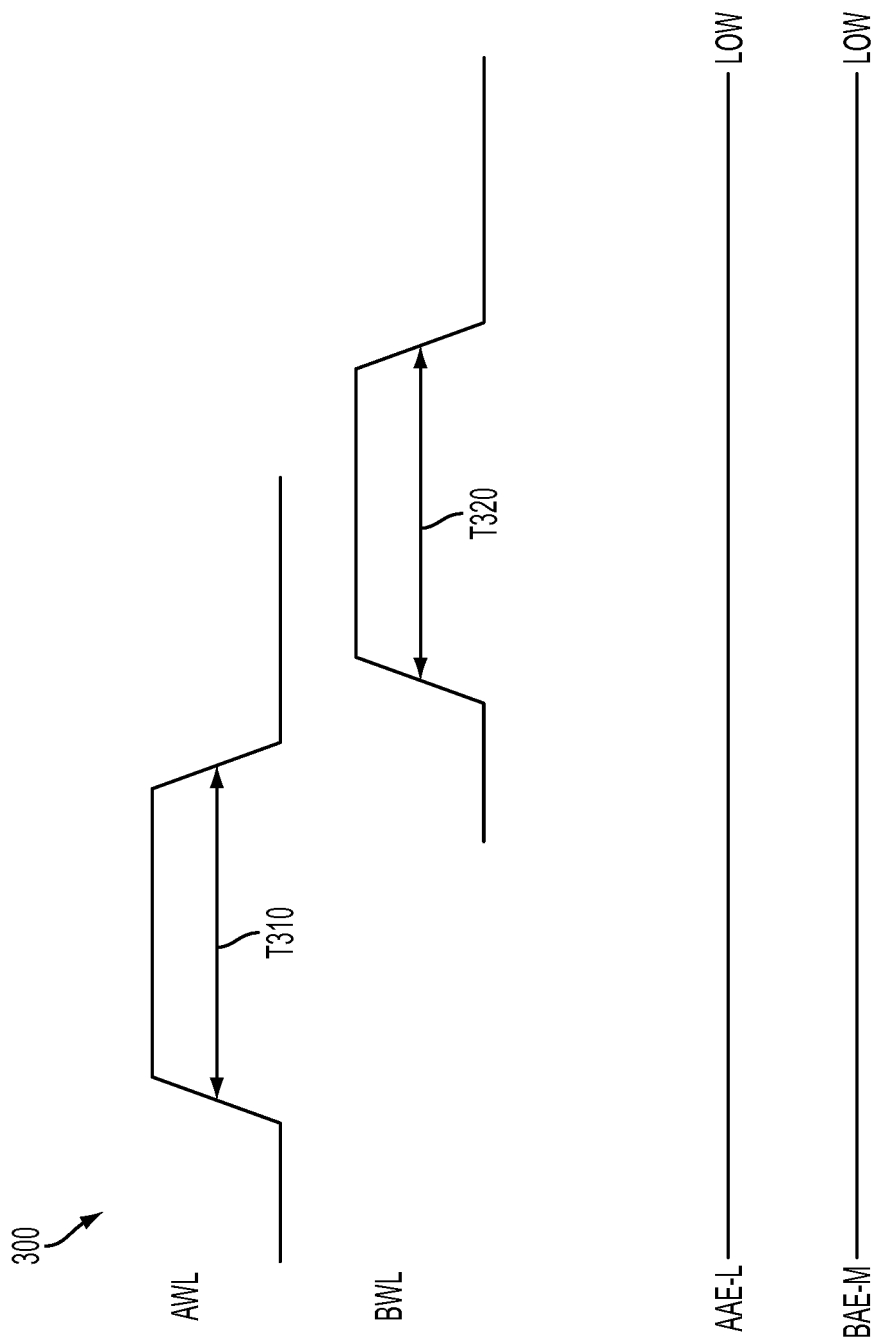
FIG. 3 is a graph of waveforms in a non-disturb condition of two memory cells in FIG. 2, in accordance with some embodiments.
Figure 4:
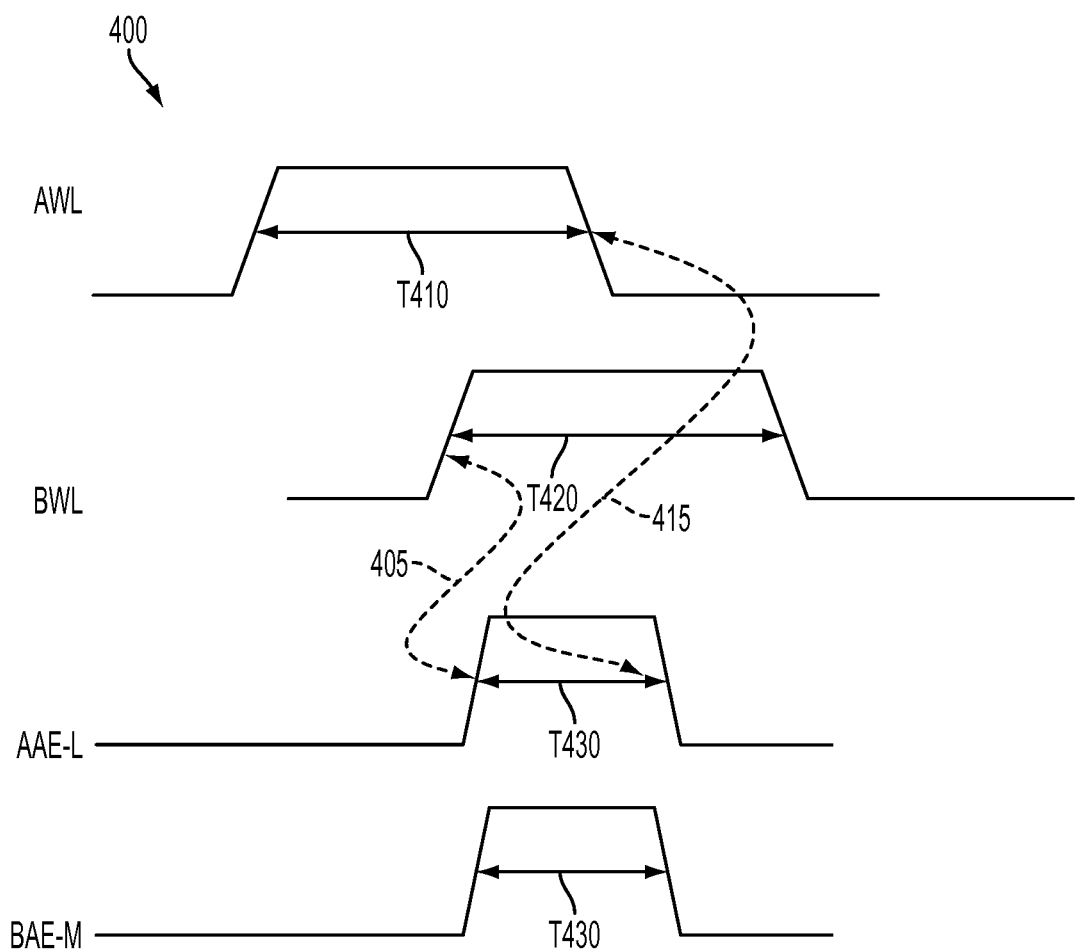
FIG. 4 is a graph of waveforms with a disturb condition of two memory cells in FIG. 2, in accordance with some embodiments.

In some embodiment, circuit AWA-L is turned off when an assist enable signal AAE-L is logically low as illustrated in FIG. 3 and is turned on when signal AAE-L is logically high as illustrated in FIG. 4. Further, circuit BWA-L is turned off when an assist enable signal BAE-L is logically low, and is turned on when signal BAE-L is logically high, in a same manner illustrated in FIG. 3 and FIG. 4 with reference to signal AAE-L. Similarly, circuit AWA-M is turned off when an assist enable signal AAE-M is logically low, and is turned on when signal AAE-M is logically high in a same manner illustrated in FIG. 3 and FIG. 4 with reference to signal AAE-L. Further, circuit BWA-M is turned off when an assist enable signal BAE-M is logically low as illustrated in FIG. 3, and is turned on when signal BAE-L is logically high as illustrated in FIG. 4.

FIG. 3 is a graph of waveforms 300 illustrating assist enable signals AAE-L and BAE-M are logically low, in accordance with some embodiments.

For illustration, port A-L of cell 100-L is write accessed during a time period T310, and port B-M of cell 100-M is either read or write accessed during a time period T320. As a result, word line AWL and word line BWL are logically high during time periods T310 and T320, respectively. However, time periods T310 and T320 are not overlapped. Consequently, the high logical values of word line AWL and word line BWL are not overlapped. Because word line BWL is logically low during time period T310, pass gates BPG-L and BPGB-L in FIG. 2 are not turned on. As a result, there is no disturb to the write from port A-L during time period T310, and signal AAE-L is logically low during time period T310. Signal AAE-L is also logically low if port B-M is accessed prior to time period T310, such as when time period T320 starts and ends before time period T310 begins.

Because accesses of port A-L and B-M and word lines AWL and BWL are not overlapped, even if port BAE-M is write accessed during time period T320, port B-M would not be disturbed by port A-M. As a result, signal BAE-M is also logically low during time period T320.

Waveforms, Disturb Example

FIG. 4 is a graph of waveforms 400 illustrating write assist signals AAE-L and BAE-M are logically high, in accordance with some embodiments.

In this illustration, port A-L of cell 100-L is write accessed during a time period T410, and port B-M of cell 100-M is either read or write accessed during a time period T420. As a result, word line AWL and word line BWL are logically high during corresponding time periods T410 and T420.

However, time periods T410 and T420 overlap for a time period T430. For example, during time period T430 while port A-L is write accessed, word line AWL is logically high. Because of the access of port B-M during time period T420, word line BWL is also logically high during time period T430. As a result, pass gates BPG-L and BPGB-L are turned on and port B-L is dummy read accessed during time period T430.

As illustratively shown in FIG. 4, when word line AWL is logically high during time period T410, a rising edge of word line BWL at the beginning of time period T420 results in both word line AWL and word line BWL being logically high. As a result, a rising edge of signal AAE-L corresponds to a rising edge of write word line BWL as illustrated by arrow 405. At the end of time period T410, a falling edge of word line AWL results in only word line BWL being logically high. As a result, a falling edge of signal AAE-L corresponds to a falling edge of write word line AWL as illustrated by arrow 415.

In some embodiments, if port B-M is write accessed during time period T420, in various embodiments of the present disclosure, port B-M is also disturbed by a dummy read from port A-M. As a result, write assist signal BAE-M associated with port B-M of cell 100-M is also generated with a logical high value during time period T430, as illustratively shown.

In FIG. 4, time period T410 starts before time period T420 starts, corresponding to port A-L being write accessed before port B-M being accessed, and is for illustration. Various embodiments of the present disclosure are also applicable when port A-L is write accessed after or at the same time with the access from port B-M. In other words, signal AAE-L is logically high corresponding to the high logical value of word line AWL and word line BWL, regardless of which word line, AWL or BWL, being activated first.

Disturb Control Circuitry

Figure 5:
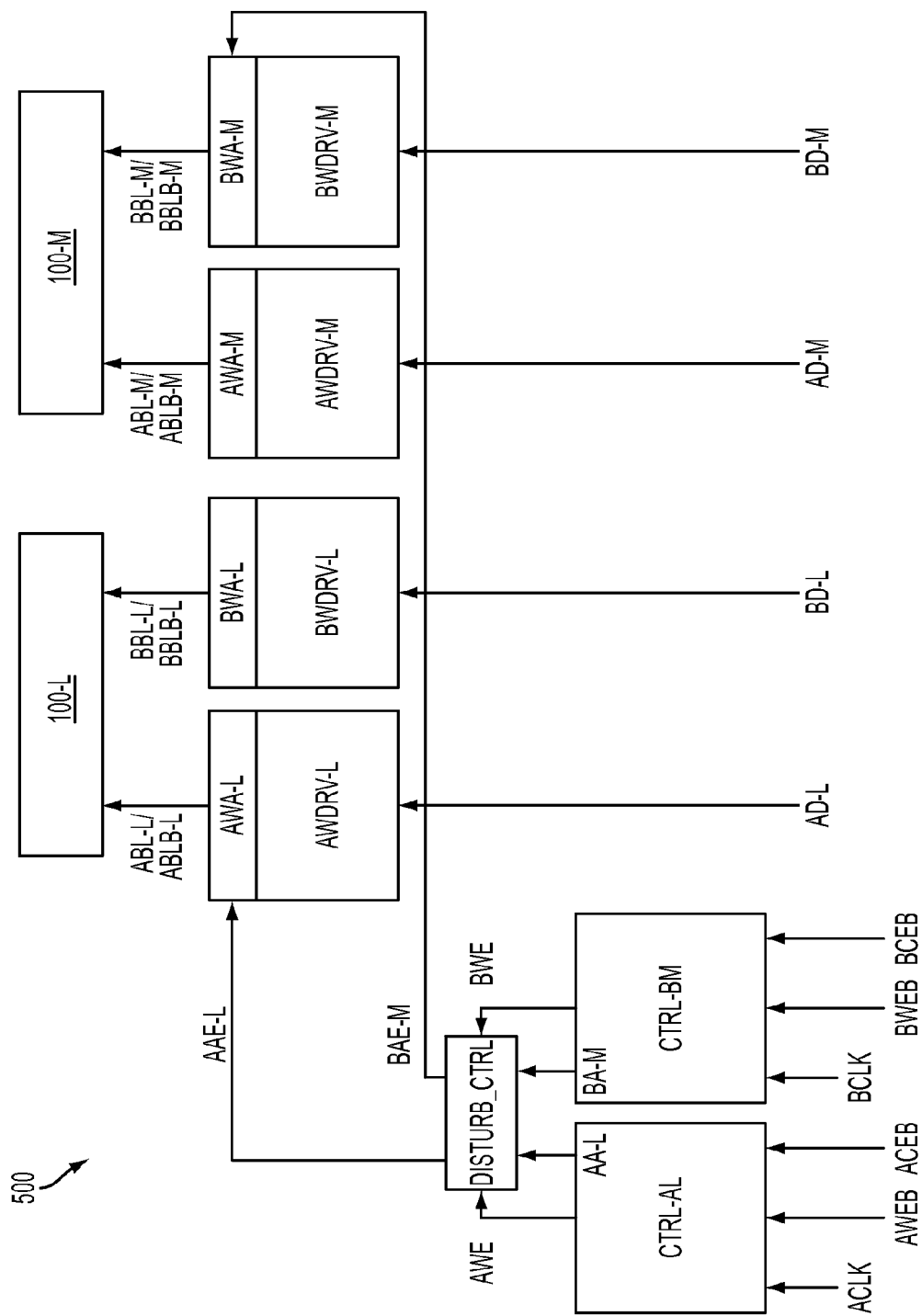
FIG. 5 is a diagram of a circuit with a disturb control mechanism for two memory cells in FIG. 2, in accordance with some embodiments.

FIG. 5 is a diagram of a circuit 500, in accordance with some embodiments. Circuit 500 includes mechanisms to control write assist circuits AWA-L, BWA-L, AWA-M, and BWA-M associated with corresponding cells 100-L and 100-M. For simplicity, write assist enable signal to control write assist circuits BWA-L and BWA-M are not shown in FIGS. 5 and 6.

For illustration, unless otherwise stated, ports A-L, A-M, B-L, and B-M have the same row address. Further, port A-L of cell 100-L is write accessed while port B-M of cell 100-M is read accessed. Because port B-M is read accessed, word line BWL is activated, pass gates BPG-L and pass gate BPGB-L are turned on, a dummy read occurs from port B-L, and port A-L is write disturbed by the dummy read from port B-L.

Signal AWEB and signal AWE have a logical inverse of one another. In some embodiments, when signal ACEB is logically low, cell 100-L is accessed. Further, when signal AWEB and signal AWE are logically low and high, respectively, port A-L is write accessed. But when signal AWEB and signal AWE are logically high and low respectively, port A-L is read accessed. Regardless of whether port A-L is read or write accessed, word line AWL is activated. In some embodiments, a waveform of word line AWL is similar to a waveform of write enable signal AWE.

Similarly, signal BWEB and signal BWE have a logical inverse of one another. In some embodiments, when signal BCEB is logically low, cell 100-M is accessed. Further, when signal BWEB and signal BWE are logically low and high, respectively, port B-M is write accessed. But when signal BWEB and signal BWE are logically high and low respectively, port B-M is read accessed. Regardless of whether port B-M is read or write accessed, word line BWL is activated. In some embodiments, a waveform of word line BWL similar to a waveform of write enable signal BWE.

Control circuit CTRL-AL and address AA-L are associated with port A-L of cell 100-L. Control circuit CTRL-AL, based on clock signal ACLK, write enable signal AWEB, and chip enable signal ACEB, generates write enable signal AWE. In some embodiments, at the rising edge of clock signal ACLK, if signal AWEB is logically low, signal AWE is generated with a high logical value.

Control circuit CTRL-BM and address BA-M are associated with port B-M of cell 100-M. Control circuit CTRL-BM, based on clock signal BCLK, write enable signal BWEB, and chip enable signal BCEB, generates write enable signal BWE. In some embodiments, at the rising edge of clock signal BCLK, if signal BWEB is logically low, signal BWE is activated with a high logical value.

Disturb control circuit DISTURB_CTRL, based on address AA-L and address BA-M, determines whether a write disturb could occur. In some embodiments, when both ports A-L and B-M are accessed, and if both cells 100-L and 100-M are on the same row, a port that is write accessed is write disturbed. Effectively, when the row address of port A-L and port B-M are the same, a write disturb may occur to both port A-L and port B-M. In some embodiments, if port A-L is write accessed, port A-L is disturbed by port B-L. If port B-M is write accessed, port B-M is disturbed by port A-M.

In some embodiments, circuit DISTURB_CTRL, compares address AA-L and address BA-M to determine whether both port A-L and B-M are on the same row. Based on the result of the comparison, and corresponding signal AWE and signal BWE, circuit DISTURB_CTRL generates write assist signals AAE-L and BAE-M. Based on the example that port A-L is write accessed, signal AWE is logically high. As a result, in some embodiments, circuit DISTURB_CTRL generates write assist signal AAE-L to be logically high to turn on write assist circuit AWA-L. In contrast, based on the example that port B-M is read accessed, write enable signal BWE is logically low. As a result, in some embodiments, circuit DISTURB_CTRL generates write assist signal BAE-M to be logically low to turn off write circuit AWA-L.

Write driver AWDRV-L receives data AD-L to generate data on bit lines ABL-L and ABLB-L for port A-L to write to cell 100-L when port A-L is write accessed. Similarly, write driver BWDRV-L receives data BD-L to generate data on bit lines BBL-L and BBLB-L for port B-L to write to cell 100-L when port B-L is write accessed. Write driver AWDRV-M receives data AD-M to generate data on bit lines ABL-M and ABLB-M for port A-M to write to cell 100-M when port A-M is write accessed, and write driver BWDRV-M receives data BD-M to generate data on bit lines BBL-M and BBLB-M for port B-M to write to cell 100-M when port B-M is write accessed.

Figure 6:
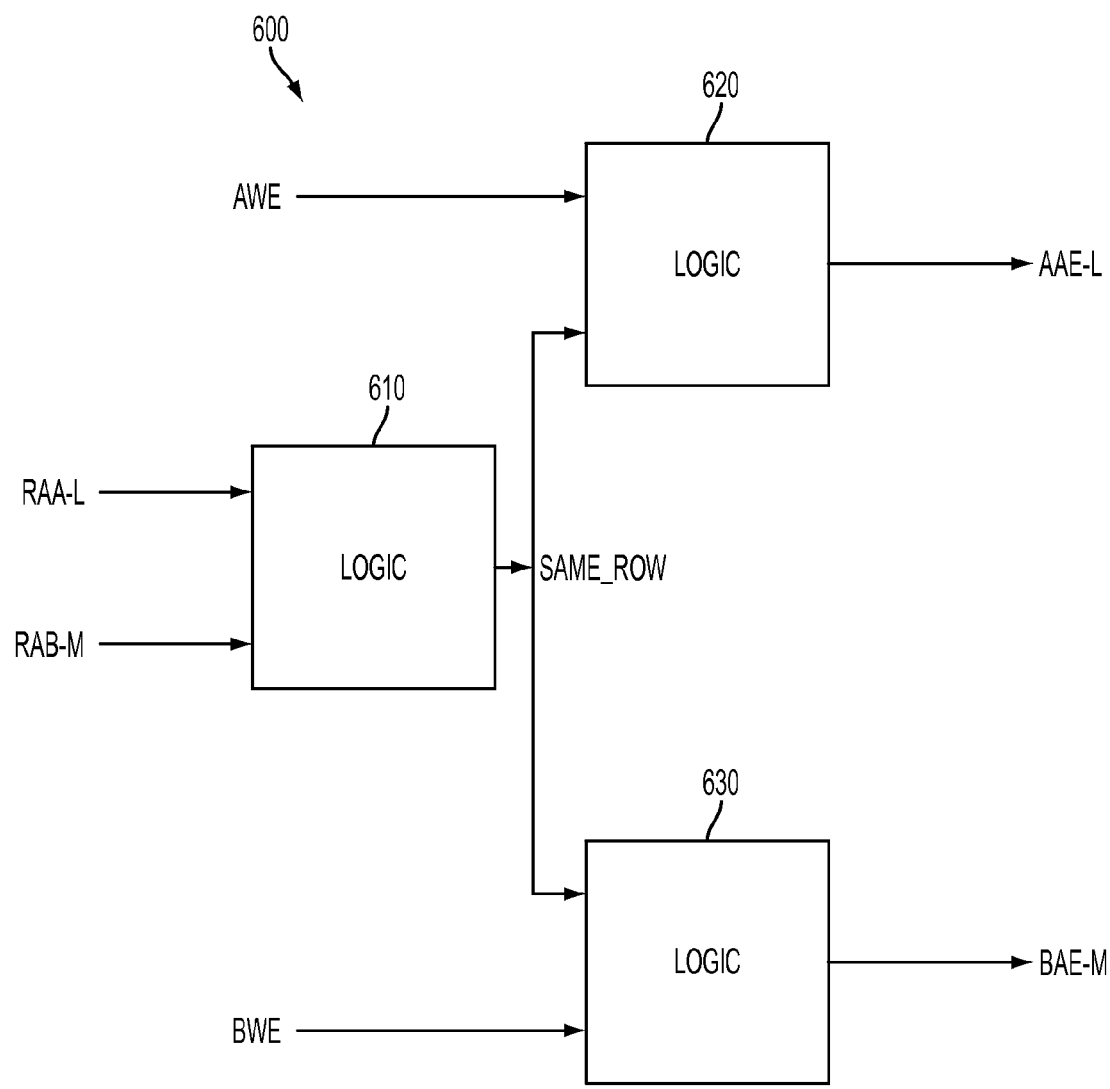
FIG. 6 is a diagram of the disturb control circuit in FIG. 5, in accordance with some embodiments.

FIG. 6 is a diagram of a circuit 600, in accordance with some embodiments. Circuit 600 is an implementation of circuit DISTURB_CRTL in FIG. 5.

Row address RAA-L is the row address of port A-L. In some embodiments, row address RAA-L is derived from address AA-L in FIG. 5. Row address RBA-M is the row address of port B-M. In some embodiments, row address RBA-M is derived from address BA-M in FIG. 5.

A circuit LOGIC 610 generates a signal SAME_ROW to be logically high when address RAA-L and RAB-M are the same. In some embodiments, LOGIC 610 includes an exclusive NOR gate. In some embodiments, signal SAME_ROW is set to be logically high during a period that word line AWL and word Line BWL are both logically high.

A logic circuit LOGIC 620 generates write assist enable signal AAE-L to be logically high when write enable signal AWE and signal SAME_ROW are both logically high. In other words, a port corresponding to write assist enable signal AAE-L is determined to be write disturbed and will be write accessed. In some embodiments, LOGIC 620 includes an AND gate.

A logic circuit LOGIC 630 generates write assist enable signal BAE-M to be logically high when write enable signal BWE and signal SAME_ROW are both logically high. In other words, a port corresponding to write assist enable signal BAE-M is determined to be write disturbed and will be write accessed. In some embodiments, LOGIC 630 includes an AND gate.

Method

Figure 7:
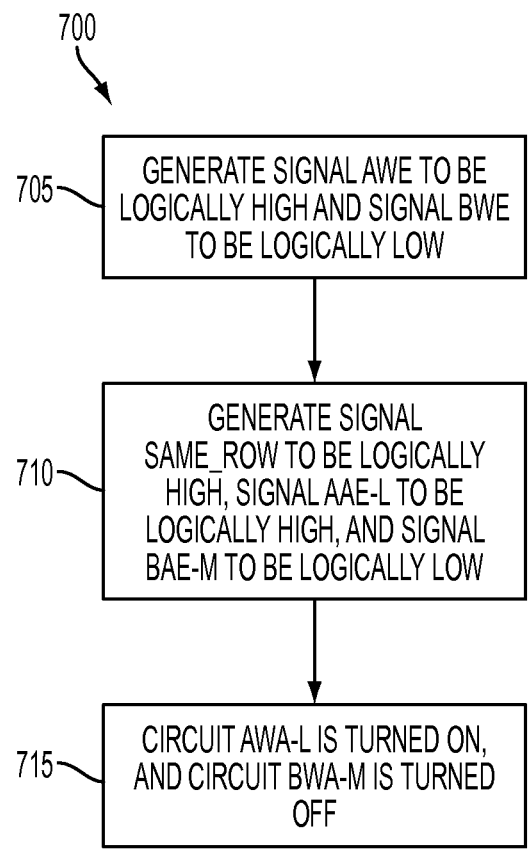
FIG. 7 is a flowchart of a method of operating the circuit in FIG. 5, in accordance with some embodiments.

FIG. 7 is a flowchart of a method 700 for operating circuit 500 in FIG. 5, in accordance with some embodiments.

In operation 705, because port A-L of cell 100-L is write accessed, circuit CTRL-AL generates write enable signal AWE to be logically high. In contrast, because port B-M of cell 100-M is read accessed, circuit CTRL-BM generates write enable signal BWE to be logically low.

In operation 710, because port A-L and B-M are on the same row, circuit LOGIC 610 in FIG. 6 generates signal SAME_ROW to be logically high. Because signal AWE and signal SAME_ROW are both logically high, circuit DISTURB_CONTROL generates write assist enable signal AAE-L to be logically high. In contrast, because signal BWE is logically low, circuit DISTURB_CONTROL generates write assist enable signal BAE-M to be logically low, regardless of the logical value of signal SAME_ROW.

In operation 715, because write assist enable signal AAE-L is logically high, write assist circuit AWA-L is turned on to help write the data on bit lines ABL-L and ABLB-L to cell 100-L. In contrast, because write assist enable signal BAE-M is logically low, port B-M is not write disturbed, and write assist circuit BWA-M is off.

Various embodiments of the disclosure are advantageous over other approaches because write assist circuit AWA-L is turned on when port A-L is both write accessed and write disturbed. In contrast, in those other approaches, write assist circuit AWA-L is turned on when port A-L is write accessed regardless of whether port A-L is write disturbed or not. As a result, power consumption due to write assist circuit AWA-L in other approaches is higher than that in various embodiments of the present disclosure.

In the above illustrations, port A-L and port B-M being write and read accessed are for illustration. Different read-write combinations of port A-L, port B-L, port A-M, and port B-M of corresponding cells 100-L and 100-M result in different ports A-L, B-L, A-M, or B-M being write disturbed. In such conditions, disturb control circuit DISTURB_CTRL generates corresponding signals to turn on and off write assist circuits AWA-L, BWA-L, AWA-M, and BWA-M accordingly.

In some embodiments, a circuit comprises a first memory cell, a second memory cell, and a disturb control circuit. The first memory cell has a first port and a second port. The first port is associated with a first write assist circuit. The second port is associated with a second write assist circuit. The second memory cell has a third port and a fourth port. The third port is associated with a third write assist circuit. The fourth port is associated with a fourth write assist circuit. The disturb control circuit is configured to selectively turn on at least one of the first write assist circuit, the second write assist circuit, the third write assist circuit, or the fourth write assist circuit according to whether the first port, the second port, the third port, or the fourth port is determined to be write disturbed.

In some embodiments, a method is based on a first memory cell and a second memory cell. The first memory has a first port associated with a first write assist circuit and a second port associated with a second write assist circuit. The second memory cell has a third port associated with a third write assist circuit and a fourth port associated with a fourth write assist circuit. In the method, it is determined if the first port and the fourth port are of a same row, and are accessed during a same time period. It is also determined if at least one of the first port or the fourth port is write accessed. Further, at least one of the first write assist circuit or the fourth write assist circuit corresponding to the first port or the fourth port that is write accessed is on.

In some embodiments, a method comprises determining whether a first port of a first memory cell is write disturbed and having a first write assist circuit associated with the first port to be on if the first port is write disturbed or having the first write assist circuit to be off if the first port is not write disturbed.

In some embodiments, in a method, a first control line of a first memory cell is caused to be activated for a write access from a first port of the first memory cell. The first control line is associated with the first port. A second control line of the first memory cell is caused to be activated. A first write assist circuit associated with the first port is on if the first port is write disturbed or is off if the first port is not write disturbed. The first port is write disturbed when the first control line and the second control line are activated during a same time period.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
   a first memory cell having a first port and a second port, the first port associated with a first write assist circuit, the second port associated with a second write assist circuit;
   a second memory cell having a third port and a fourth port, the third port associated with a third write assist circuit, the fourth port associated with a fourth write assist circuit; and
   a disturb control circuit configured to selectively turn on at least one of the first write assist circuit, the second write assist circuit, the third write assist circuit, or the fourth write assist circuit according to whether the first port, the second port, the third port, or the fourth port is determined to be write disturbed.

2. The circuit of claim 1, wherein
   the disturb control circuit is configured to generate a first write assist enable signal, a second write assist enable signal, a third write assist enable signal, and a fourth write assist enable signal corresponding to the first write assist circuit, the second write assist circuit, the third write assist circuit, and the fourth write assist circuit.

3. The circuit of claim 2, wherein the disturb control circuit is configured
   to generate the first write assist enable signal when signals for the second port are in a read condition that causes the first port to be write disturbed;
   to generate the second write assist enable signal when signals for the first port are in a read condition that causes the second port to be write disturbed;
   to generate the third write assist enable signal when signals for the fourth port are in a read condition that causes the third port to be write disturbed; and
   to generate the fourth write assist enable signal when signals for the third port are in a read condition that causes the fourth port to be write disturbed.

4. The circuit of claim 1, comprising:
   a first control circuit associated with the first memory cell and configured to provide first information related to the first memory cell to the disturb control circuit, the first information including a first address of the first cell, a read-write status of the first port and a read-write status of the second port; and
   a second control circuit associated with the second memory cell and configured to provide second information related to the second memory cell to the disturb control circuit, the second information including a second address of the second memory cell, a read-write status of the third port and a read-write status of the fourth port.

5. The circuit of claim 1, comprising
   a first logic circuit configured to compare at least a row address of the first port and a row address of the fourth port or a row dress of the second port and a row address of the third port.

6. The circuit of claim 5, comprising a second logic circuit configured to generate at least one of
   a first write assist enable signal based on an output of the first logic circuit and a read-write status of the first port;
   a second write assist enable signal based on the output of the first logic circuit and a read-write status of the second port;
   a third write assist enable signal based on the output of the first logic circuit and a read-write status of the third port; or
   a fourth write assist enable signal based on the output of the first logic circuit and a read-write status of the fourth port.

7. The circuit of claim 1, wherein
   the first port comprises a first control line coupled with a first pair of pass gates;
   the second port comprises a second control line coupled with a second pair of pass gates;
   the third port comprises the first control line coupled with a third pair of pass gates; and
   the fourth port comprises the second control line coupled with a fourth pair of pass gates.

8. The circuit of claim 7, wherein
   a first pass gate of the first pair of pass gates and a first pass gate of the second pair of pass gates are coupled with a first storage node of the first memory cell;
   a second pass gate of the first pair of pass gates and a second pass gate of the second pair of pass gates are coupled with a second storage node of the first memory cell;
   a first pass gate of the third pair of pass gates and a first pass gate of the fourth pair of pass gates are coupled with a first storage node of the second memory cell; and
   a second pass gate of the third pair of pass gates and a second pass gate of the fourth pair of pass gates are coupled with a second storage node of the second memory cell.

9. The circuit of claim 1, wherein
   a time the first write assist circuit is configured to be on corresponds to a first activation time period of the first control line and a second activation time period of the second control line;
   a time the second write assist circuit is configured to be on corresponds to a third activation time period of the first control line and a fourth activation time period of the second control line;
   a time the third write assist circuit is configured to be on corresponds to a fifth activation time period of the first control line and a sixth activation time period of the second control line; and
   a time the fourth write assist circuit is configured to be on corresponds to a seventh activation time period of the first control line and an eighth activation time period of the second control line.

10. A method comprising:
    based on a first memory cell having a first port associated with a first write assist circuit and a second port associated with a second write assist circuit and a second memory cell having a third port associated with a third write assist circuit and a fourth port associated with a fourth write assist circuit:
    determining if the first port and the fourth port are of a same row, and are accessed during a same time period;
    determining if at least one of the first port or the fourth port is write accessed; and
    having at least one of the first write assist circuit or the fourth write assist circuit corresponding to the first port or the fourth port that is write accessed to be on.

11. The method of claim 10, wherein
    the first port and the third port use a same first control line; and
    the second port and the fourth port use a same second control line.

12. A method comprising:
  determining whether a first port of a first memory cell is write disturbed; and
  having a first write assist circuit associated with the first port to be on if the first port is write disturbed or having the first write assist circuit to be off if the first port is not write disturbed.

13. The method of claim 12, wherein determining whether the first port of the first memory cell is write disturbed comprises:
  determining whether a first port of a second memory cell is accessed during a time period the first port of the first memory cell is write accessed; and
  determining at least one of the following conditions:
    whether the first port of the first memory cell and the first port of the second memory cell are of a same row; or
    whether the first memory cell and the second memory cell are of a same row.

14. The method of claim 12, wherein
  the first port of the first memory cell is write disturbed when a first control line associated with the first port of the first memory cell is activated during a time period a second control line associated with a second port of the first memory cell is activated.

15. The method of claim 12, wherein
  the first port of the first memory cell is write disturbed when a first control line associated with the first port of the first memory cell is activated during a time period a second control line associated with the first port of the second memory cell is activated.

16. The method of claim 12, further comprising:
  determining whether the first port of the second memory cell or a second port of the second memory cell is write disturbed; and
  turning on a write assist circuit associated with the first port of the second memory cell or turning on a write assist circuit associated with the second port of the second memory cell.

17. The method of claim 12, wherein
  pass gates associated with a second port of the first memory cell are coupled with storage nodes of the first memory cell;
  the storage nodes are to be written from the first port of the first memory cell; and
  the first port of the first memory cell is write disturbed when the pass gates are turned on.

18. A method comprising:
  causing a first control line of a first memory cell to be activated for a write access from a first port of the first memory cell, the first control line associated with the first port;
  causing a second control line of the first memory cell to be activated; and
  having a first write assist circuit associated with the first port to be on if the first port is write disturbed or having the first write assist circuit to be off if the first port is not write disturbed, the first port being write disturbed when the first control line and the second control line are activated during a same time period.

19. The method of claim 18, comprising:
  accessing a first port of a second memory cell on a same row with the first memory cell that causes the second control line of the first memory cell to be activated.

20. The method of claim 19, wherein
  if the first port of the second memory cell is write accessed, signals for a second port of the second memory cell are in a read condition; or
  if the second port of the second memory cell is write accessed, signals for the first port of the second memory cell are in a read condition.

* * * * *